(12) United States Patent
Beer et al.

(10) Patent No.: US 7,048,450 B2
(45) Date of Patent: May 23, 2006

(54) OPTOELECTRONIC MODULE WITH TRANSMITTER CHIP AND CONNECTING PIECE FOR THE MODULE WITH RESPECT TO AN OPTICAL FIBER AND WITH RESPECT TO A CIRCUIT BOARD, AND METHODS FOR PRODUCING THE SAME

(75) Inventors: Gottfried Beer, Nittendorf (DE); Nikolaus Schunk, Maxhütte-Haidhof (DE)

(73) Assignee: Infineon Technologies, AG, Munich (DE)

( * ) Notice: Subject to any disclaimer, the term of this patent is extended or adjusted under 35 U.S.C. 154(b) by 6 days.

(21) Appl. No.: 10/890,258

(22) Filed: Jul. 14, 2004

(65) Prior Publication Data
US 2005/0018977 A1  Jan. 27, 2005

(30) Foreign Application Priority Data
Jul. 14, 2003  (DE)  ................................ 103 32 015

(51) Int. Cl.
*G02B 6/36* (2006.01)
(52) U.S. Cl. ........................................................ 385/88
(58) Field of Classification Search ..................... None
See application file for complete search history.

(56) References Cited

U.S. PATENT DOCUMENTS

| | | | |
|---|---|---|---|
| 5,475,783 A | 12/1995 | Kurashima | |
| 6,154,592 A * | 11/2000 | Tagashira | 385/88 |
| 6,483,960 B1 * | 11/2002 | Schroedinger | 385/14 |
| 6,659,659 B1 * | 12/2003 | Malone | 385/94 |
| 6,729,775 B1 * | 5/2004 | Panzer et al. | 385/92 |
| 6,892,449 B1 * | 5/2005 | Brophy et al. | 29/827 |
| 2002/0004251 A1 * | 1/2002 | Roberts et al. | 438/26 |
| 2002/0167017 A1 * | 11/2002 | Nakabayashi et al. | 257/98 |
| 2003/0042403 A1 * | 3/2003 | Joshi | 250/214.1 |
| 2003/0053767 A1 * | 3/2003 | Cheng et al. | 385/89 |
| 2003/0201462 A1 * | 10/2003 | Pommer et al. | 257/200 |

FOREIGN PATENT DOCUMENTS

| | | |
|---|---|---|
| DE | 19738168 A1 | 3/1999 |
| WO | WO 02/39513 A1 | 5/2002 |

* cited by examiner

*Primary Examiner*—Michelle Connelly-Cushwa
*Assistant Examiner*—Chris Chu
(74) *Attorney, Agent, or Firm*—Edell, Shapiro & Finnan, LLC

(57) ABSTRACT

An optoelectronic module and a connecting piece for the module with respect to an optical fiber and with respect to a circuit board can have a semiconductor chip in the form of an optical transmitter chip, which has a light-wave-emitting top side and has a rear side contact as a cathode on its rear side. Further semiconductor chips are embedded in a plastics composition with the optical transmitter chip in such a way that a coplanar overall top side is formed from the plastics composition and the active top side.

15 Claims, 12 Drawing Sheets

OPTOELECTRONIC MODULE WITH TRANSMITTER CHIP AND CONNECTING PIECE FOR THE MODULE WITH RESPECT TO AN OPTICAL FIBER AND WITH RESPECT TO A CIRCUIT BOARD, AND METHODS FOR PRODUCING THE SAME

CROSS REFERENCE TO RELATED APPLICATIONS

This application claims priority under 35 USC §119 to German Application No. DE 103 32 015.6, filed on Jul. 14, 2003, and titled "Optoelectronic Module with Transmitter Chip and Connecting Piece for the Module with Respect to an Optical Fiber and with Respect to a Circuit Board, and Methods for Producing the Same," the entire contents of which are hereby incorporated by reference.

FIELD OF THE INVENTION

The invention relates to an optoelectronic module with a transmitter chip and a connecting piece for the module with respect to an optical fiber and with respect to a circuit board, and to methods for producing the same.

BACKGROUND

The transmitter chip, semiconductor chips, and passive components form the electronic components of an optoelectronic module of this type and are usually arranged on a circuit substrate or on a panel in the form of a printed circuit board in a plurality of module positions. An arrangement of this type requires the production of electrical connections from contact areas of the module components to contact pads on the circuit substrate towards the circuit substrate or towards the panel in each of the module positions. These connections are produced by time-consuming and cost-intensive connection techniques, such as soldering, ultrasonic bonding and/or thermocompression bonding, which thermally and mechanically loads the module components and impairs the reliability of the optoelectronic module, and additionally causes high costs.

An optoelectronic module which has an improved reliability and can be produced more cost-effectively is desirable. Moreover, to use a connecting piece to achieve a reliable interaction between a module and an optical fiber, and with respect to a circuit board is desirable.

SUMMARY

An optoelectronic module can have a semiconductor chip in the form of an optical transmitter chip. The transmitter chip can have a light-wave-emitting top side with a top side contact with respect to an anode. A rear side contact of a cathode can be arranged on a rear side of the transmitter chip. In addition to the transmitter chip, the optoelectronic module can have further semiconductor chips for optical reception and/or for signal amplification and/or for driving of the semiconductor chips. These semiconductor chips may not have rear side contacts, but rather have contact areas on their active top sides. Finally, the optoelectronic module can include passive components with corresponding electrodes for impedance matching of the input and output of the module.

The active sides of the semiconductor chips can form a coplanar overall top side with their respective contact areas with the electrodes of the passive components and together with a surrounding plastic housing composition. The contact areas of the semiconductor chips, the electrodes of the components, and a contact pad of a connecting element can be arranged in an accessible manner on the coplanar overall top side. The connecting element can connect the rear side contact of the transmitter chip to the contact pad of the connecting piece.

In a module of this type, a rear side contact of module components, in particular, of the transmitter chip, can be contact-connected from the overall top side by the connecting piece. Moreover, the electrical connections between transmitter chip, further semiconductor chips, and electrodes of passive components may not have to overcome level jumps. Rather, it can be possible to arrange a rewiring stratum with corresponding rewiring lines in the planar overall top side. Complex connecting techniques such as a bonding technique, flip-chip technique, or soldering technique can be obviated. It can thus be possible, with the transmitter chip, to embed many semiconductor chips and passive components in a plate-type plastics composition to form an optoelectronic module. Furthermore, in addition to the rewiring lines, external contact areas may also be provided in the rewiring stratum. Individual contact areas or contact pads of the module components can be connected to the external contact areas.

Such a wiring of the optoelectronic module with the aid of rewiring lines may be effected within a single rewiring layer. This rewiring layer can be augmented by further insulation layers and rewiring layers. A plurality of rewiring layers can be connected to one another by through-contact areas through the insulation layers. This can result in a multilayered rewiring stratum which can be formed without a high outlay on the overall top side including semiconductor top sides and plastic top side.

The light-emitting top side of the transmitter chip and the light-sensitive regions of photodiodes can interact with the surroundings. For example, either passage openings or insulation layers can be provided in the rewiring stratum. Passage openings can uncover the light-sensitive or light-emitting areas of the corresponding semiconductor chips. Or, the insulation layers can be produced from a transparent plastic. Light-emitting regions and photosensitive regions on the overall top side may additionally have optical lens in order to influence the respective optical beam path or to amplify the optical effect.

The optical transmitter chip can be a VCSE laser diode or a vertical cavity surface emitting laser diode. Such a VCSE laser diode can have a vertical cavity on the light-wave-emitting top side and can have an anode as the top side contact. The cathode of a laser diode can be formed as a rear side contact.

A VCSEL diode can permit cost-effective solutions for data and telecommunications applications for manufacturers of optical modules, such as transceivers or transponders. While VCSEL diodes at wavelengths of 850 nm can cover ranges up to 300 m in data communications, VCSEL diodes with a wavelength range of 1310 nm permit transmissions over distances of, for example, up to 10 km. In order to achieve such distances, a special housing technology has been developed in conjunction with an optoelectronic module according to the invention.

The optoelectronic modules equipped with VCSEL diodes may be equipped with an extended monitoring interface for digital diagnosis. The monitoring interface can permit real-time access to operating parameters of the module, such as, for example, the bias current of the laser, the transmitted optical power, the received optical power, the internal transceiver temperature, and the supply voltage. In this case, the modules can support the internal calibration of measurements by the operating temperature and can be provided with an integrated alarm, and threshold sensors for monitoring the module.

Modules with these sensors give a warning, if a specific value lies outside the operating range. The module can operate in an improved and extended temperature range, can exhibit a high electromagnetic compatibility, and can have improvement in the pulse phase equalization or the "jitter performance".

In one embodiment of the invention, the connection element, which can offer a contact pad on the overall top side and can connect this contact pad to the rear side contact of the optical transmitter chip, may have a base, which can be embedded in the plastics composition and has the contact pad on the overall top side. Before the module components are embedded in a plastics composition, the embedded rear side of the base may be connected via a bonding wire connection to the rear side contact of the optical transmitter module. With a connecting element of this type, it can be possible, for example, in the case of an optoelectronic module, also to contact-connect rear side contacts of semiconductor chips in the plastic housing composition. Consequently, rear side contacts embedded in this way can be accessible from the overall top side.

The connecting element may also be formed in an L-shaped manner. One limb of the L-shape with the contact pad can be accessible from the overall top side and the other limb of the L-shape overlapping the rear side contact of the transmitter chip so that an electrical connection of the overlapping limb to the rear side contact of the transmitter chip becomes possible by a conductive adhesive or by solder material. A connecting element of this type has the advantage over a base with a bonding wire that this connection can be mechanically stabler and can be less endangered than a bonding wire when the components can be embedded in the plastics composition.

A further embodiment of the invention can provide for arranging the module on a first region of a connecting piece with respect to an optical fiber and a superordinate circuit board such that an optical axis of optoelectronic components can be oriented parallel to the superordinate circuit board. A second region of the connecting piece can have plug contact areas, which can be plugged into a plug socket of the superordinate circuit board. Connecting lines can be arranged between the plug contact areas of the second region and the connections of the first region with respect to external contacts of the optoelectronic module, which connecting lines can run rectilinearly in an embodiment or implementation of the connecting piece. The plug socket and the plug contact areas can be arranged at right angles to the top side of the circuit board and enabling vertical plugging-in or plugging-together.

In a further embodiment of the connecting piece, the first and second regions can be arranged in angled fashion with respect to one another, it can be possible for the second region to be plugged into a correspondingly formed plug socket of the circuit board with its plug contact areas parallel to the circuit board. The vertical plugging-in capability can have the smaller component height for the connecting piece.

The connecting piece may be a moulded interconnect device having a three-dimensional wiring. An interconnect device of this type may have a header in addition to the connecting piece itself. The header can receive an optical fiber in a tube section, the optical axes of fiber and tube sections of the optoelectronic module can be centred on one another through the tube section.

A moulded interconnect device can have the connecting piece, the header, and the tube section produced integrally in one moulding operation. In this case, a three-dimensional wiring may be applied onto the moulded structure, the wiring merging with the plug contact areas, the plug contact areas for their part being operatively connected to the superordinate circuit board.

The lock or locking means may also be integrally moulded on the integral interconnect device. Such lock or locking means can serve, on the one hand, for fixing the enclosure of an optical fiber in the tube section and, on the other hand, for fixing the header on the circuit board itself after the latching of the plug contact areas in the plug socket of the circuit board.

Furthermore, it can be possible to form the connecting piece from a circuit carrier. The circuit carrier can be separated into a first and a second region. The first and second regions can be connected to one another via a flexible part, such as a conductor track sheet. Such a conductor track sheet may also be realized by arranging a supporting sheet onto the existing conductor tracks of the circuit carrier in the section between the first and second regions. For this purpose, a single-sided adhesive plastic sheet as the flexible sheet can be used.

A circuit carrier divided into two in this way may be angled in the region of the flexible conductor track sheet so that the first and second regions can be at an angle to one another, a first limb of the angled portion can have the optoelectronic module, and the second limb of the angled portion can receive the plug contact areas. Such a preformed and prepared connecting piece made from a circuit carrier may be arranged at a header. In one embodiment of the invention, the header can have a plug-in region for one end of an optical waveguide or of a fiber of an optical waveguide. In this case, a polymer optical fiber can be used as the optical waveguide. Such polymer fibers can also be known under the abbreviation POF.

Furthermore, the header may have a lock or locking means, which can fix the waveguide end in the header and can fixedly clamp the header on the superordinate circuit board. The design of these locks or locking means can be configured in various ways and can depend on the type of design of the plug socket on the superordinate circuit board. If the plug socket on the superordinate circuit board can be provided for parallel plugging-in of the plug contact areas, then a snap-action device can be provided as the lock or locking means of the header on the circuit board. The snap-action device can engage into an opening of the circuit board as soon as the connecting piece can be completely inserted into the plug-in socket with its plug contacts. In the case of a vertical arrangement of the plug socket for the plug-in contacts, a locking means can be provided for the header, which can engage in a spreading fashion into an opening of the circuit board and can be latched there.

A method for producing an optoelectronic module can provide a panel with module positions arranged in rows and columns. The panel may already have external contacts on external contact areas of the module in each component position so that individual optoelectronic modules can be produced by separation of the panel.

A method for producing a panel for a plurality of optoelectronic modules, which has module positions arranged in rows and columns, can include the following method steps. Firstly, an optical semiconductor transmitter chip can be applied with a light-wave-emitting top side onto a single-sided adhesive carrier. A rear side contact of the semiconductor transmitter chip can initially be freely accessible on its rear side. Then, a connecting element can be applied with its contact pad on the adhesive side of the carrier. Afterwards, the connecting element can be connected to the rear side contact of the transmitter chip. This connection may either be realized by a bonding wire, or the connecting element can be formed such that it has a limb, which can overlap the rear side contact of the transmitter chip and can thus be soldered on the latter or can be fixed with a conductive adhesive.

After mounting the semiconductor transmitter chip and the connecting element on a single-sided adhesive carrier, further semiconductor chips for optical reception and/or for signal amplification and/or for driving of the semiconductor chip may be applied with their active top sides on the adhesive layer of the carrier. Finally, passive components with their electrodes can be applied on the adhesive side of the single-sided adhesive carrier, it can be possible for these passive components to serve for impedance matching of the optoelectronic components of the module.

After application, positioning, and fixing of the individual module components in the module positions of the single-sided adhesive carrier, a plastics composition can be applied on the carrier with the semiconductor chips and the components can be embedded in the plastics composition with the formation of a coplanar overall top side on the carrier. The coplanar overall top side can be initially not accessible so that it may not be possible to carry out a wiring of the contact pad of a connecting element with respect to a semiconductor chip transmitter, the contact areas of the further semiconductor chips, and the electrodes of the passive components.

Next, the plastics composition can be cured in order to obtain a self-supporting composite board including plastics composition with semiconductor chips and passive components. Afterwards, the carrier can be removed from this composite board and a rewiring stratum can be applied onto the freed overall top side of the composite board. This can produce a panel, which can have functional optoelectronic modules which, by way of example, may represent a transceiver if a photodiode is arranged in a receiving region and a VCSEL diode, as explained in more detail above, can be arranged in a transmitting region. Finally, external contacts in the form of solder balls for solder deposits or in the form of elastic external contacts may be applied on the external contact areas of the panel before the panel can be separated into individual optoelectronic modules.

A further aspect of the invention relates to a method for producing a connecting piece between an optoelectronic module, an optical fiber of an optical waveguide, and a superordinate circuit board. The optoelectronic module can be arranged in a first region of the connecting piece. A second region can have plug contact areas, which can be plugged into a plug socket of a circuit board and can be wired with the optoelectronic module of the first region. In order to produce a connecting piece of this type, the circuit carrier can be produced with receptacle positions for an optoelectronic module in a first region and with plug contact areas in a second region.

Afterwards, a boundary groove can be incorporated into the circuit carrier along the boundary between the two regions while retaining the electrical wiring between the regions. In this case, care is taken to ensure that a sufficient thickness of the circuit carrier material can remain at the bottom of the boundary groove so that the two regions can be angled with respect to one another while the boundary groove can be heated. After the angling of the two regions with respect to one another, the connecting element can be completed for a use which involves the plug connections being able to be plugged in parallel to the top side of the superordinate circuit board.

As a further possibility for angling the two regions of the connecting piece with respect to one another, it is possible to apply a reinforcing sheet on the wiring side of the circuit carrier, which is then bent for angling the two regions relative to one another. Finally, it can be possible to separate the two regions of the circuit carrier, to arrange a flexible conductor track sheet between the two regions, and finally to angle the two regions with respect to one another.

To summarize, in the case of the optoelectronic module according to the invention, integrated components in the form of semiconductor chips and optical transducer components in the form of laser diode chips and photodiode chips can be fixed with their contact areas in each case on a single-sided adhesive auxiliary carrier. If the optoelectronic transducer components have rear side contacts, special connecting elements can be used in order to produce as it were a "bypass" to the rear side contact from an overall top side of the optoelectronic module. Commercially available non-transparent moulding compositions can be used as the plastics composition for the electronic module, the components of the module being embedded in the moulding composition. Afterwards, the auxiliary carrier can be removed and a wiring of the individual module components can be carried out on the overall top side via a rewiring stratum.

This rewiring stratum may have a plurality of wiring planes. Bonding connections may not be necessary for interconnecting the individual module components. For the optoelectronic transducer modules, either photopatternable dielectrics that are transparent to the operating wavelength are used or windows may be etched free in the insulation layer of the rewiring stratum.

Coupling lenses may also be provided on the light-sensitive or light-emitting regions. A transceiver module can include a transmitting module and a receiving module, which can be singulated from a "wafer panel". A "wafer panel" can be a panel, which has module positions arranged in rows and columns and whose external dimensions correspond to those of a semiconductor wafer so that installations from semiconductor wafer technology can be used for individual fabrication steps. Further passive components which may be accommodated in the plastics composition, such as RC elements, for example, can be realized on a connecting piece using the MID technique (moulded interconnect device technique).

An interconnect or connecting piece in the form of an MID circuit carrier can be patterned such that it can have, in one direction, a fiber receptacle in the form of a round ferrule embodiment. The electrical feed contacts can be embodied such that the electrical contacts can be soldered or plugged on by plugging onto an SMD (surface mounted device) connector strip or a surface mountable connector strip of a superordinate circuit board as main circuit carrier. Microlenses for improving the optical properties of the optical transducer components may already be applied onto the "wafer panel" in each module position or be added to the optoelectronic module in a later step.

Furthermore, it can be established that, with the aid of the invention, the moulded connecting piece which can be produced using the MID technique may also be realized by a circuit carrier. In the case of a "vertically pluggable" solution, the circuit carrier can be used directly by providing a first region with the optoelectronic module and a second region with the plug contact areas on the circuit carrier.

In the case of a "horizontally pluggable" solution, by introducing a boundary groove, for example, by separation grinding by a wafer saw, the circuit carrier can be cut open except for a small residual thickness, which can include the metal strata so that the circuit carrier can be bent by 90°. A mechanical reinforcement in the form of an adhesively bonded-on or laminated-on sheet on the mounting side of the circuit carrier can prevent cracking and thus possible signal interruptions during the angling process.

The use of a circuit carrier in the form of an "FR4 board" makes it possible to realize a vertically or horizontally pluggable "transceiver" which complies with the "Small Form Factor" or can easily be adapted for another standardized header embodiment.

The circuit carrier's "board" that is coated with a copper layer on both sides outside the circuit wiring can ensure good EMC protection with regard to front irradiation. Complete EMC protection can be achieved by the plastics composition of the module if the composition can be produced from conductive moulding composition. With this conductive moulding composition, the module components on the auxiliary carrier can be provided with an insulating coating before the electrically conductive plastics composition can be applied.

The tubular sections for a "fiber ferrule guide" for receiving one end of an optical fiber may be integrated directly in the header. The optoelectronic module with the horizontally pluggable transceiver embodiment opens up the consumer market for optical transceivers since, in a modular transceiver arrangement, these can be retrofitted as required at any time. A circuit carrier for the connecting piece, the circuit carrier for the horizontally pluggable transceiver embodiment can be converted into a three-dimensional wiring arrangement by incipient sawing and bending-over without the conductor tracks having to be applied three-dimensionally.

BRIEF DESCRIPTION OF THE FIGURES

The invention will now be explained in more detail with reference to the accompanying figures.

DETAILED DESCRIPTION

Figure 1:
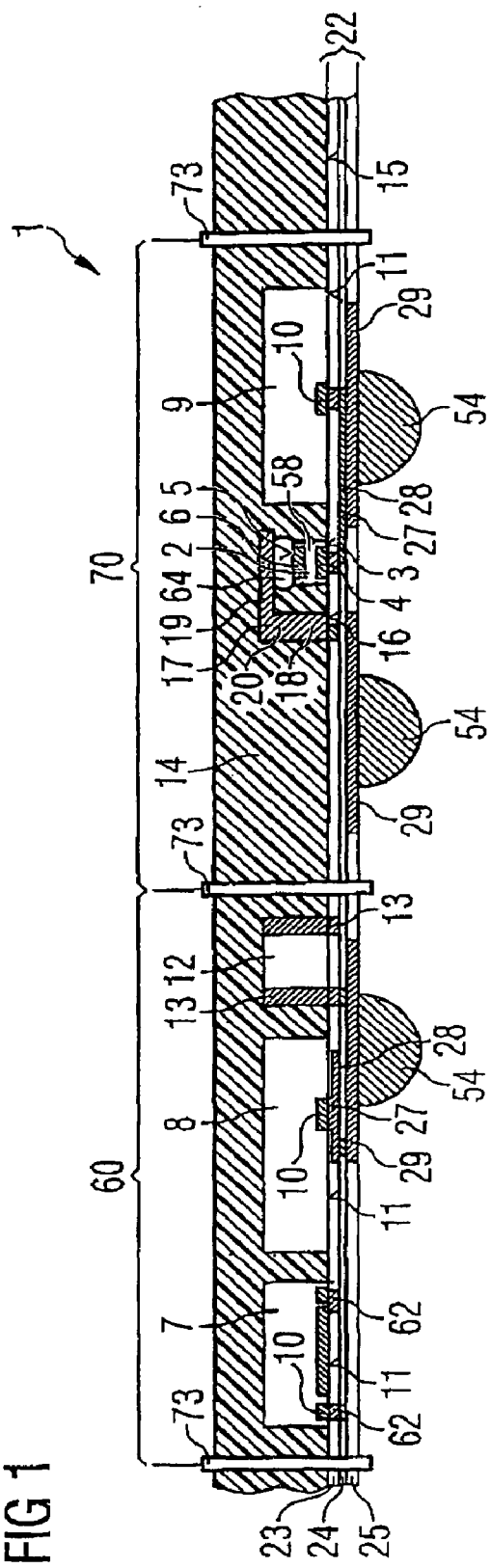
FIG. 1 shows a diagrammatic cross section through a module of a first embodiment of the invention.

FIG. 1 shows a diagrammatic cross section through an optoelectronic module 1 of a first embodiment of the invention. The optoelectronic module 1 can have an amplifying chip 8 for amplifying a signal from a photodiode, which can be arranged in a receiving region 60 of the optoelectronic module 1 in the form of a receiving chip 7. Furthermore, passive components 12 can be arranged in the receiving region 60, of which passive components a resistor with its electrodes 13 can be seen in cross section. The active top sides of the semiconductor chips 7 and 8 in the receiving region 60 can be arranged such that their active top sides 11 with the electrodes 13 of the passive component 12 and with the plastics composition 14 surrounding the module components can form a coplanar overall top side 15. In this case, the contact areas and electrodes, which are to be wired together and which are to be connected to external contact areas 29, can be reached from the overall top side 15. The module components in the receiving region 60 can have rear side contacts, so that with the arrangement of the active top sides or the electrodes in the region of the overall top side 15, the contact-connection problems for the receiving region 60 can be solved from the overall top side.

Arranged in the transmitting region 70 of the optoelectronic module 1 can be a VCSEL diode 58 (Vertical Cavity Surface Emitting Laser) in the form of a transmitter chip 2. Such laser diodes can operate perpendicularly and can have a vertical cavity on their active top side 3. The vertical cavity can emit light so that the rewiring structure arranged thereabove can be constructed from transparent insulation layers and from transparent patterned electrical layers with transparent electrodes and transparent conductor tracks. The transparent electrodes or conductor tracks can be made of indium oxide, while the transparent insulation layers can include acrylic resin. Besides the transmitter chip 2, there can be a semiconductor chip 9 for controlling and driving the transmitter 2.

The rear side contact 6 for the cathode of the VCSEL diode 58 may not be directly accessible from the overall top side 15. In the first embodiment according to FIG. 1, a connecting element 17 can have a cross section of an L-shape. One limb 19 of the connecting element 17 can overlap the rear side contact 6 of the VCSEL diode, while the second limb 20 can form a base having a contact pad 16 towards the overall top side 15. The second limb 20 can be formed like a base whose bottom side can form the contact pad 16. Consequently, it can be possible to connect the VCSEL diode 58 from the overall top side 15 despite a rear side contact 6.

Wafer sawing cuts 73, which can be made with a wafer saw, are depicted at the boundaries of the receiving region 60 and the transmitting region 70. The receiving chip 7 with a photodiode may have a lens on the light-sensitive top side. The same applies to the light-emitting top side of the VCSEL diode 58.

The wiring of the module components in this first embodiment of the invention can include a receiving chip 7, an amplifying chip 8, a resistor 12, a transmitter chip 2, and a control and driver chip 9 achieved by the rewiring stratum 22. The rewiring stratum 22 can include an insulation layer 23 with through-contact areas 62, a rewiring layer 24 with rewiring lines 28, and an external contact area layer 25 with external contact areas 29. In this case, the greater area proportion both of the external contact area layer and of the rewiring layer 27 can be a transparent insulation material and an electrically conductive material can be used at the locations at which rewiring lines 28 or external contact areas 29 or through-contact openings 51 are situated. Even this electrically conductive material is transparent, if the conduction material used is not a metal, but rather conductive oxides, such as indium oxide.

Figure 2:
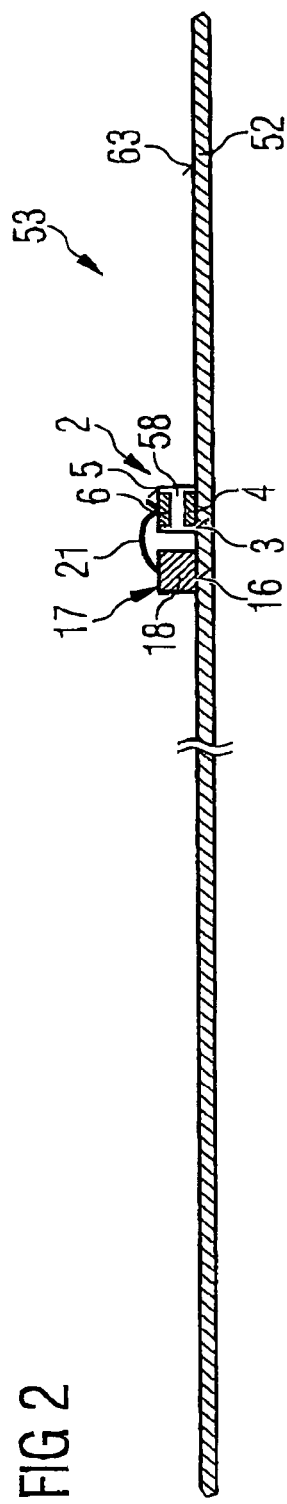
FIG. 2 shows a schematic sketch for a connection of a rear side contact of a VCSEL diode to a contact pad on a single-sided adhesive carrier of a second embodiment of the invention.

FIGS. 2 to 7 show production of an optoelectronic module at a module position of a panel. FIG. 2 shows a schematic sketch for a connection of a rear side contact 6 of a transmission diode, i.e., a VCSEL diode 58, for example, to a contact pad 16 on a single-sided adhesive carrier 52 of a second embodiment of the invention. For this purpose, the VCSEL diode 58 has been applied with its emitting top side 3 with having a vertical cavity onto the adhesive side 63 of the carrier 52. This VCSEL diode 58 can have an anode 4 on its light-emitting top side 3. The anode can be fixed on the adhesive side 63 of the carrier 52. The VCSEL diode 58 shown here can operate on a wavelength of 1310 nm and can be suitable for an optoelectronic module with a transceiver which operates at 2.6 gigabits per second.

In this case, the transceiver, as shown in FIG. 1, can include a receiving region 60 and a transmitting region 70. The VCSEL diode 58 can be used in the transmitting region. In order also to be able to contact-connect the rear-side contact from the adhesive side 63 of the carrier 52, the module position 53 can have a metallic base 18 arranged with a contact pad 16 on the adhesive side 63 of the carrier 52. On its rear side, the base can be connected via a bonding wire 21 to the rear side contact 6 of the VCSEL diode 58. This principle of rear side connection may not be restricted to the application shown here, but rather can be employed whenever semiconductor chips or passive components are to be contact-connected on their rear sides.

Figure 3:
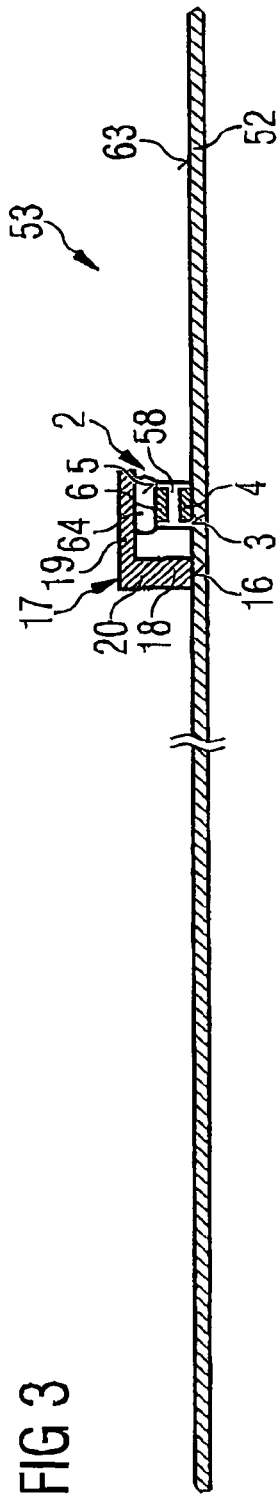
FIG. 3 shows a schematic sketch for a connection of a rear side contact of a VCSEL diode to a contact pad on a single-sided adhesive carrier from FIG. 2 of a third embodiment of the invention.

FIG. 3 shows a schematic sketch for a connection of a rear side contact 6 of a VCSEL diode 58 to a contact pad 16 on the single-sided adhesive carrier 52 from FIG. 2, in accordance with a third embodiment of the invention. The VCSEL diode 58 can be placed on the adhesive side 63 of the carrier 52 with its light-emitting top side 3. Instead of a base and a bonding connection, as shown in FIG. 2, now a metal piece, which can be L-shaped in cross section, can be used as a connecting element 17. The L-shaped metal piece can have, on a first limb 19, an overlap region, which can overlap the rear side contact 6 of the VCSEL diode 58. The base 18 with the contact pad 16 can form a second limb of the L-shaped cross section. This connecting element 17 can be placed onto the adhesive side 63 of the carrier 52 after the positioning of the VCSEL diode 58 and the rear side contact 6 of the VCSEL diode 58 can be connected to the overlapping limb 19 of the connecting element 17 by a conductive adhesive 64. The rear side contact 6 can thus be reached for a wiring via the contact pad 16 on the adhesive side 63 of the carrier 52.

Figure 4:
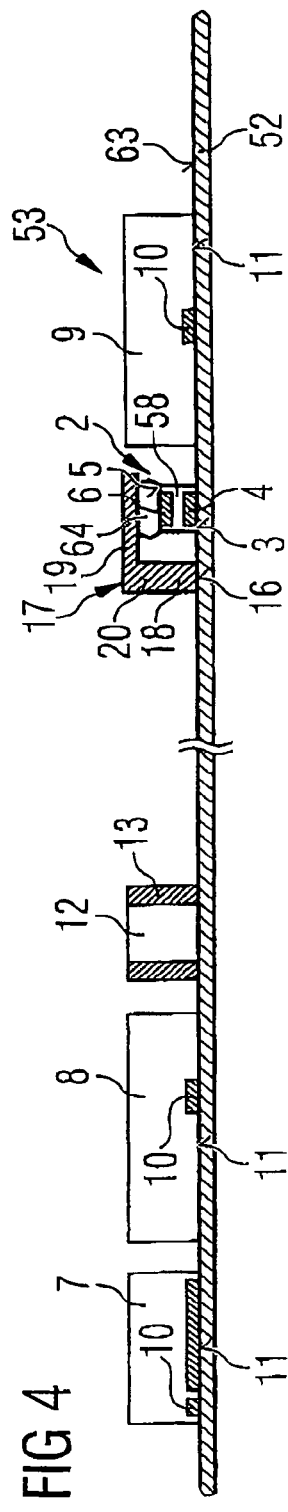
FIG. 4 shows a diagrammatic cross section through a module position of a single-sided adhesive carrier in accordance with FIG. 3 with further semiconductor chips applied.

FIG. 4 shows a diagrammatic cross section through a module position 53 of a single-sided adhesive carrier 52 in accordance with FIG. 3 with applied further semiconductor chips 7, 8, 9 and a passive component 12. The arrangement and orientation of these module components correspond to the orientation and arrangement, as shown in FIG. 1. In addition to the functions realized by the semiconductor chips 2, 7, 8, 9, the iSFP (intelligent Small Form Factor Pluggable) transceiver module according to the invention and further semiconductor chips, which provide a monitoring interface for digital diagnosis. Such a monitoring interface can permit real-time access to operating parameters, such as the bias current of the laser, the transmitted optical power, the received optical power, the internal transceiver temperature, and can monitor the supply voltage.

The module can support the internal calibration of measurements by corresponding semiconductor chips in that it monitors the operating temperature and can have threshold sensors for an integrated alarm. Such threshold sensors can warn the user if a specific value outside an operating range occurs. Furthermore the module components of the transceiver module can afford an extended temperature range and a high electromagnetic compatibility, and a low pulse phase distortion and thus an improved "jitter performance".

Figure 5:
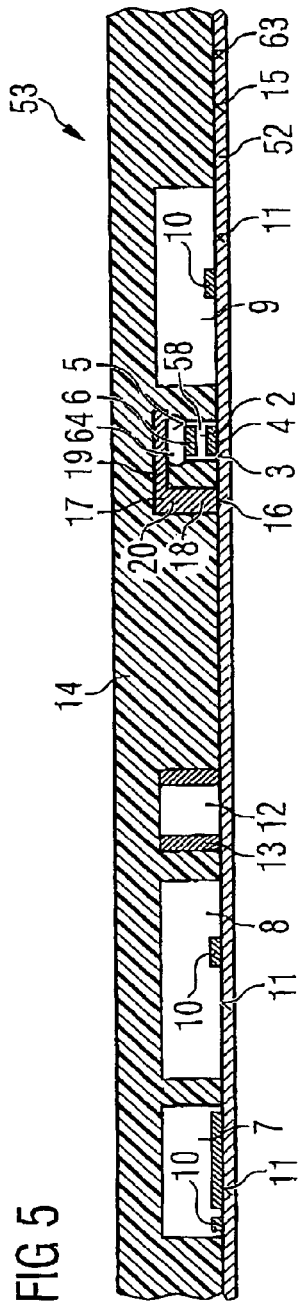
FIG. 5 shows a diagrammatic cross section through a module position of a panel after application of a plastics composition onto the carrier in accordance with FIG. 4.

FIG. 5 shows a diagrammatic cross section through a module position 53 of a panel after the application of a plastics composition 14 onto the carrier 52 in accordance with FIG. 4. During this application of the plastics composition 14, the rear sides and edge sides of the module components can be embedded in plastics composition. However, the top sides can be fixed in the adhesive side 63 of the carrier 52 of the module components, and, in particular, of the electrodes 13 of the passive component 12 and the contact areas 10 of the active top sides of the semiconductor chips 7, 8 and 9 can remain accessible free of plastics composition 14.

Figure 6:
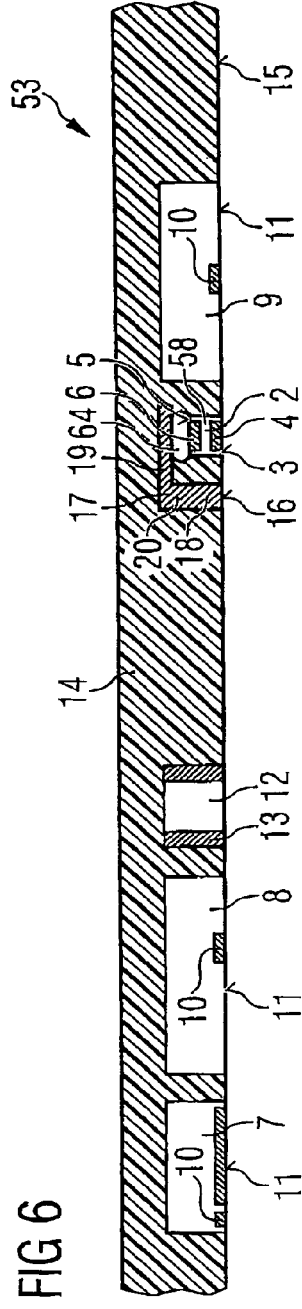
FIG. 6 shows a diagrammatic cross section through a module position of a panel after the removal of the carrier which is shown in FIG. 5.

FIG. 6 shows a diagrammatic cross section through a module position 53 of a panel after the removal of the carrier 52 shown in FIG. 5. By removal of the carrier 52, which, for example, may be carried out by pulling it off, rolling it off or by stripping it off, the contact areas 10, the top side contact 4 of the optical transmitter chip 2, the contact pad 16 of the connecting element 17, and the electrodes 13 of the passive component 12 can be freely accessible. Consequently, it may be possible to apply a wiring structure in the form of a rewiring stratum 22. The rewiring stratum 22 can include a plurality of insulation and patterned rewiring layers.

Figure 7:
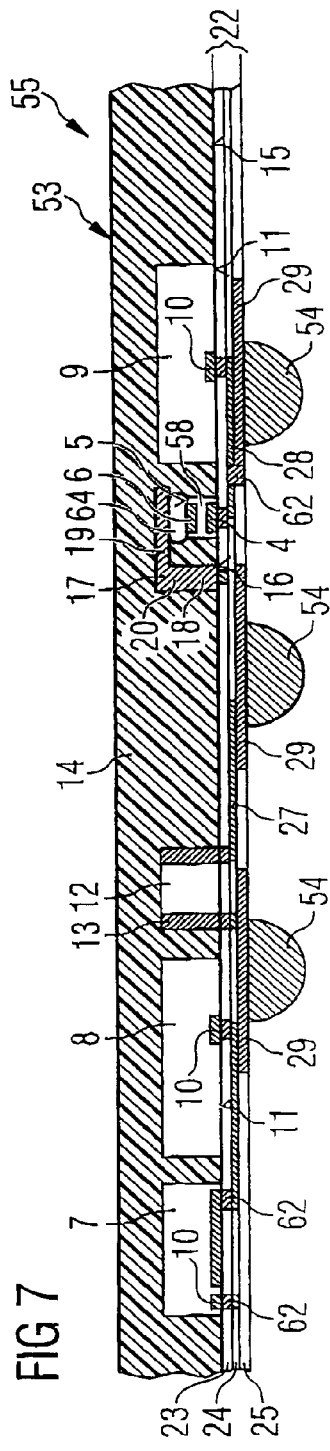
FIG. 7 shows a diagrammatic cross section through a module position of a panel after the application of a rear rewiring plane and external contacts onto a composite board which is shown in FIG. 6.

FIG. 7 shows a diagrammatic cross section through a module position 53 of a panel 55 after the application of a rewiring stratum 22 and after the application of external contacts 54 onto the external contact areas 29 of an external contact stratum 25 of the rewiring layer 27. The external contacts 54 can be connected to the contact areas of the semiconductor chips 2 and 9 via rewiring lines 28 and through-contact areas 62.

Figure 8:
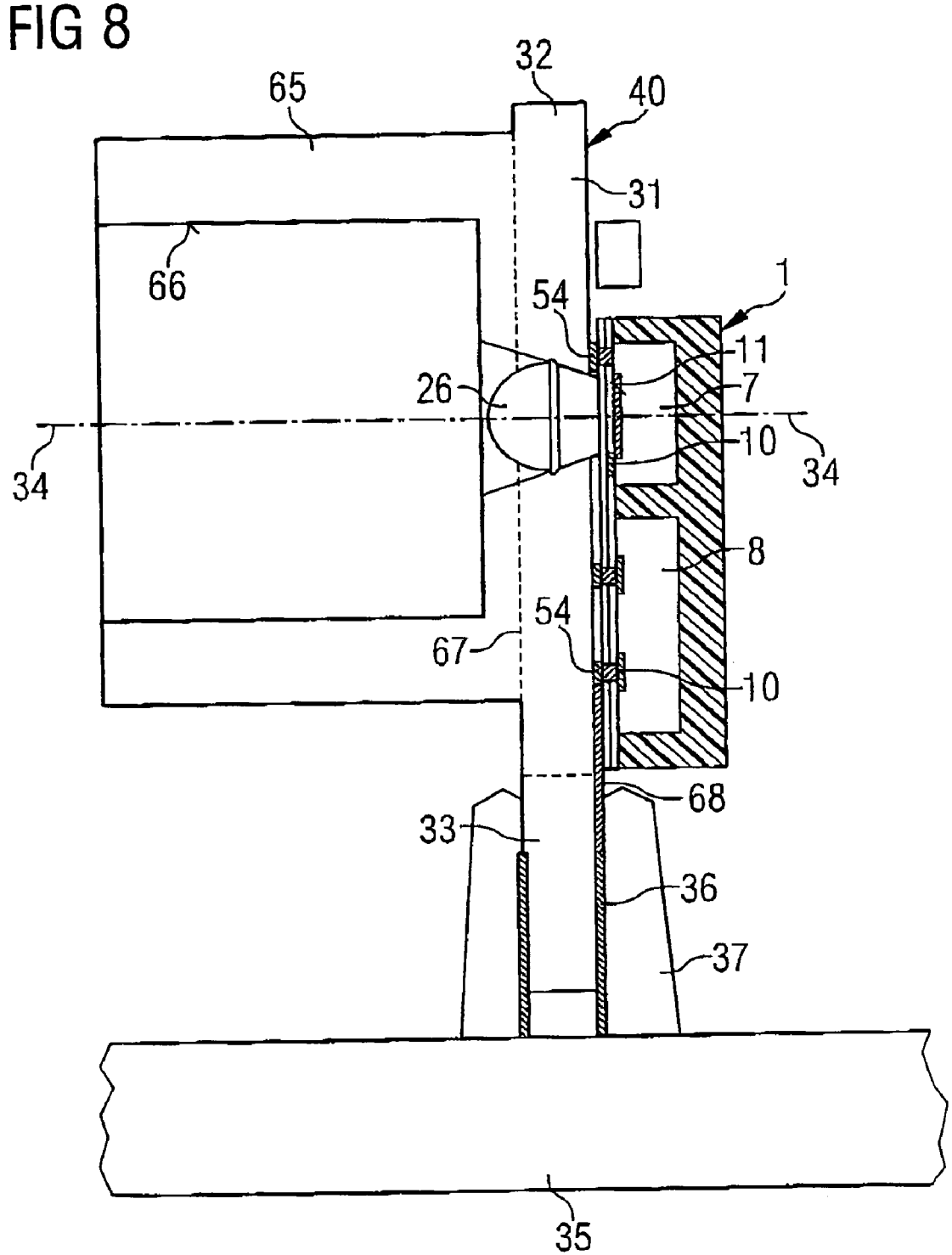
FIG. 8 shows a cross section through an optoelectronic module arranged on a circuit board with a connecting piece with respect to an optical fiber and with respect to the circuit board of a fourth embodiment of the invention.

FIG. 8 shows a diagrammatic cross section through an optoelectronic module 1 can be arranged on a circuit board 35 with a moulded connecting piece 32, which can be suitable for receiving an optical fiber and can produce a connection to a superordinate circuit board 35 of a fourth embodiment of the invention. For this purpose, the connecting piece 32 can be divided into two regions, namely a region 31 carrying the optoelectronic module 1 and a second region 33 having plug contact areas 37 on both sides of the connecting piece 32.

The moulded connecting piece 32 may already have a tubular section 65, which can be formed integrally during moulding with the connecting piece 32 and can provide for a fiber ferrule guide 66. The end of a polymer optical fiber with its holder can be inserted into the tubular section 65. In this case, the axis of the tubular section 65 can be oriented according to the optical axis 34 of a lens 26 for a photodiode of the optoelectronic module 1. In this case, the light-sensitive component can be the receiving chip 7 with a photosensitive region of its active top side 11.

The amplifying chip 8 of the receiving region of the transceiver module is shown below this here in cross section. Instead of integral molding of tubular sections 65 with ferrule guide 66 and the connecting piece 32 with an opening and mount for a lens 67, the connecting piece 32 may also be produced separately as a plate, as shown by the dashed line 67. The optical axis 34 of the light-sensitive component and that of the holder (not shown) of the polymer optical fiber are arranged parallel to the superordinate circuit board 35. The circuit board 35 can carry a plug socket 37 into which the second region 33 with the plug contact areas 36 can be plugged vertically. The connection of the outputs of the optoelectronic module 1 to the plug contact areas 36 can be produced via the external contacts 54 of the optoelectronic module 1 and connecting conductor tracks on the connecting piece 32.

Figure 9:
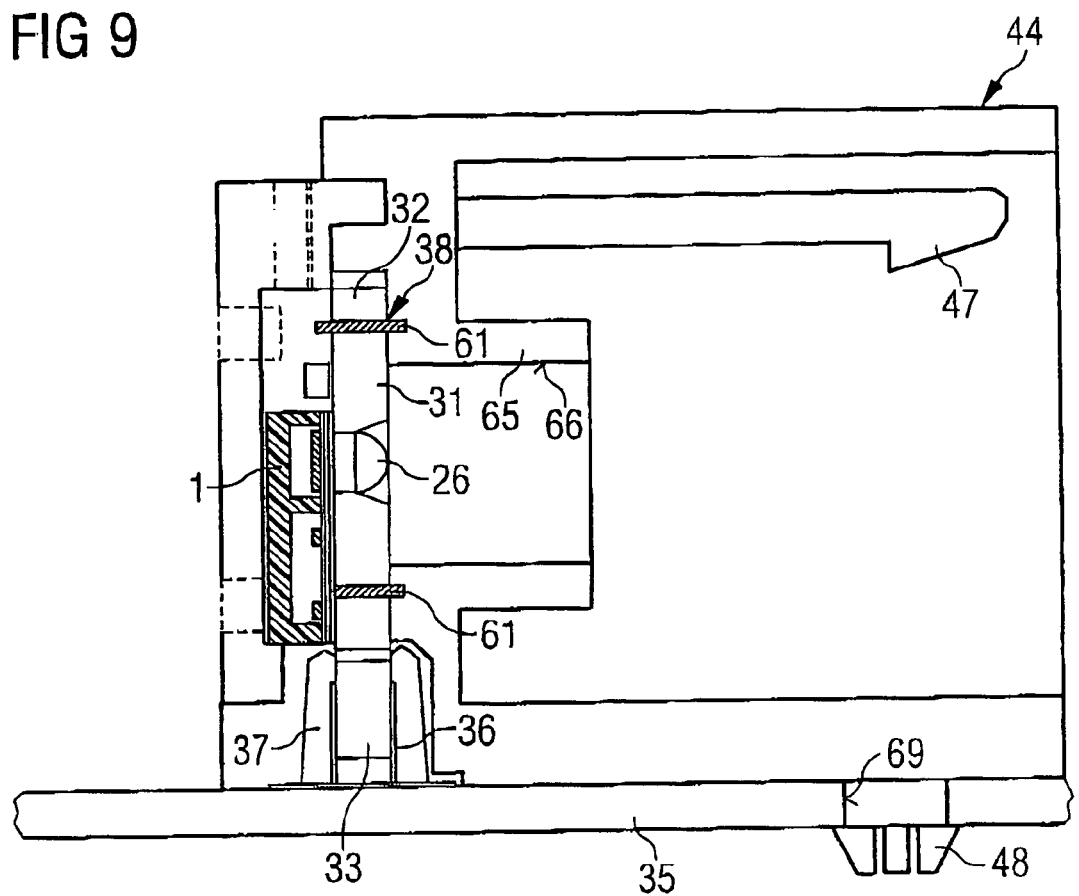
FIG. 9 shows a diagrammatic cross section through an optoelectronic module arranged on a circuit board with a connecting piece and header of a fifth embodiment of the invention.

FIG. 9 shows a diagrammatic cross section through an optoelectronic module 1 arranged on a circuit board 35 with a connecting piece 32 and header 44 of a fifth embodiment of the invention. In this fifth embodiment of the invention, the plate, indicated by a dashed line in FIG. 8, of a connecting piece 32 can be realized by a circuit carrier, which can be fixed onto a header in an accurately fitting manner by fitting pins 61. The header 44 can include not only the tubular section 65, but also a lock or locking means 47 and 48. The locking means 47 can fix the end piece or the holder of a polymer optical fiber by a snap-action hook, while the locking means 48 can fix the header 44 on the circuit board 35 when the plug contact areas 36 are plugged into the plug socket 37 of the circuit board 35. In this case, the fixing element 48 can spread after leading through an opening 69 in the superordinate circuit board 35.

Figure 10:
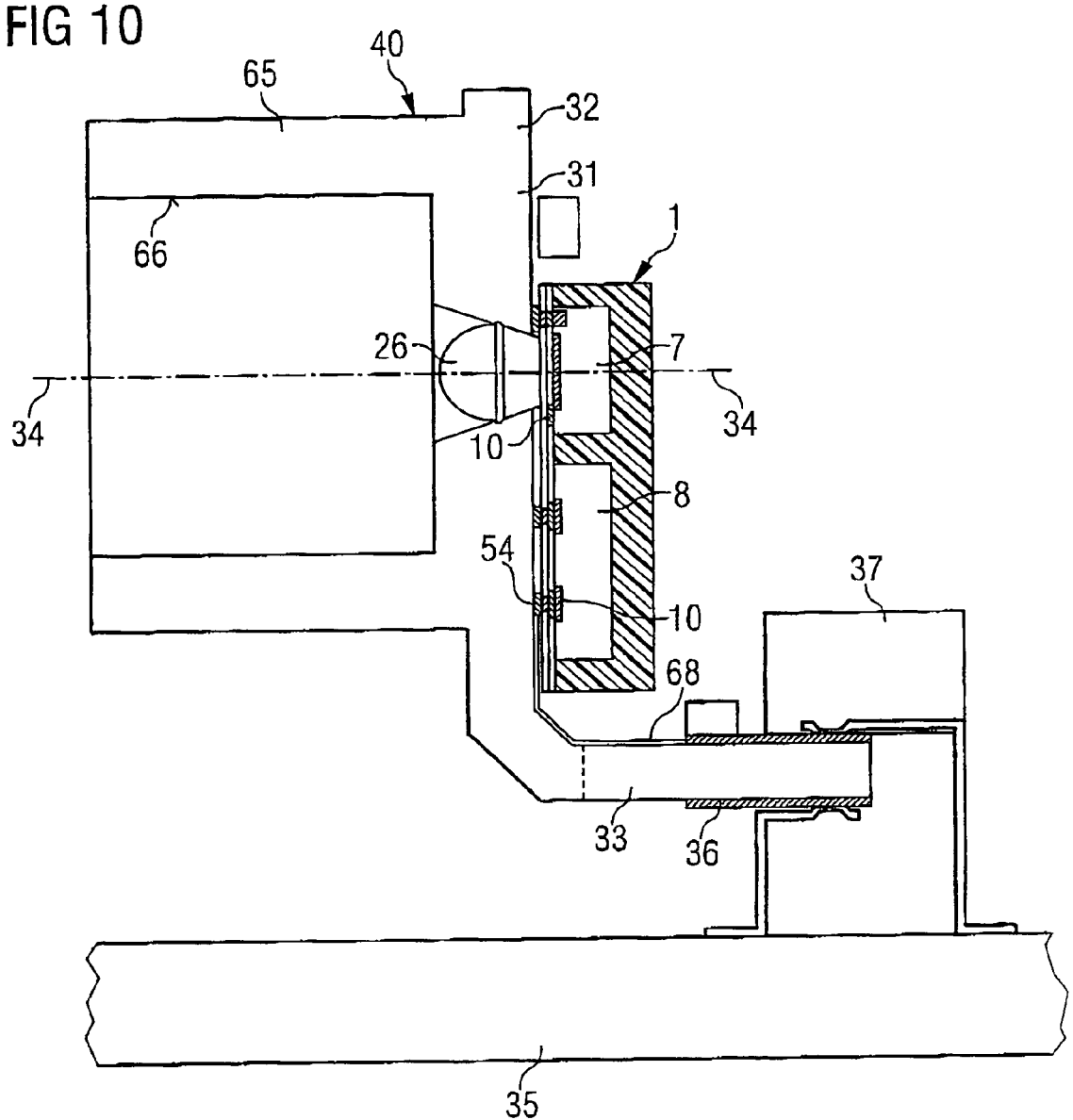
FIG. 10 shows a diagrammatic cross section through an optoelectronic module arranged on a circuit board with a connecting piece of a sixth embodiment of the invention.

FIG. 10 shows a diagrammatic cross section through an optoelectronic module 1 arranged on a circuit board 35 with a connecting piece 32 of a sixth embodiment of the invention. This connecting piece 32 can be plugged into a plug socket 37 on the circuit board 35 parallel to the circuit board 35. For this purpose, a first region 31 carrying the optoelectronic module 1 can be angled with respect to a second region 33 having the plug contact areas such that the optical axis 34 can remain oriented parallel to the superordinate circuit board 35. In this sixth embodiment, this angled connecting piece 32 having the regions 31 and 33 can be again moulded and integrally moulded with the tubular section 65 for a fiber ferrule guide 66. The conductor tracks 68 can extend three-dimensionally between the two regions 31 and 33. Consequently, the angled moulded connecting piece 32 with integrally moulded tubular section 65, which can be suitable for a receptacle for an optical fiber, can form an MID device or a moulded interconnect device 40. Instead of an angled moulded interconnect device, FIG. 11 shows the possibility of an angled circuit carrier.

Figure 11:
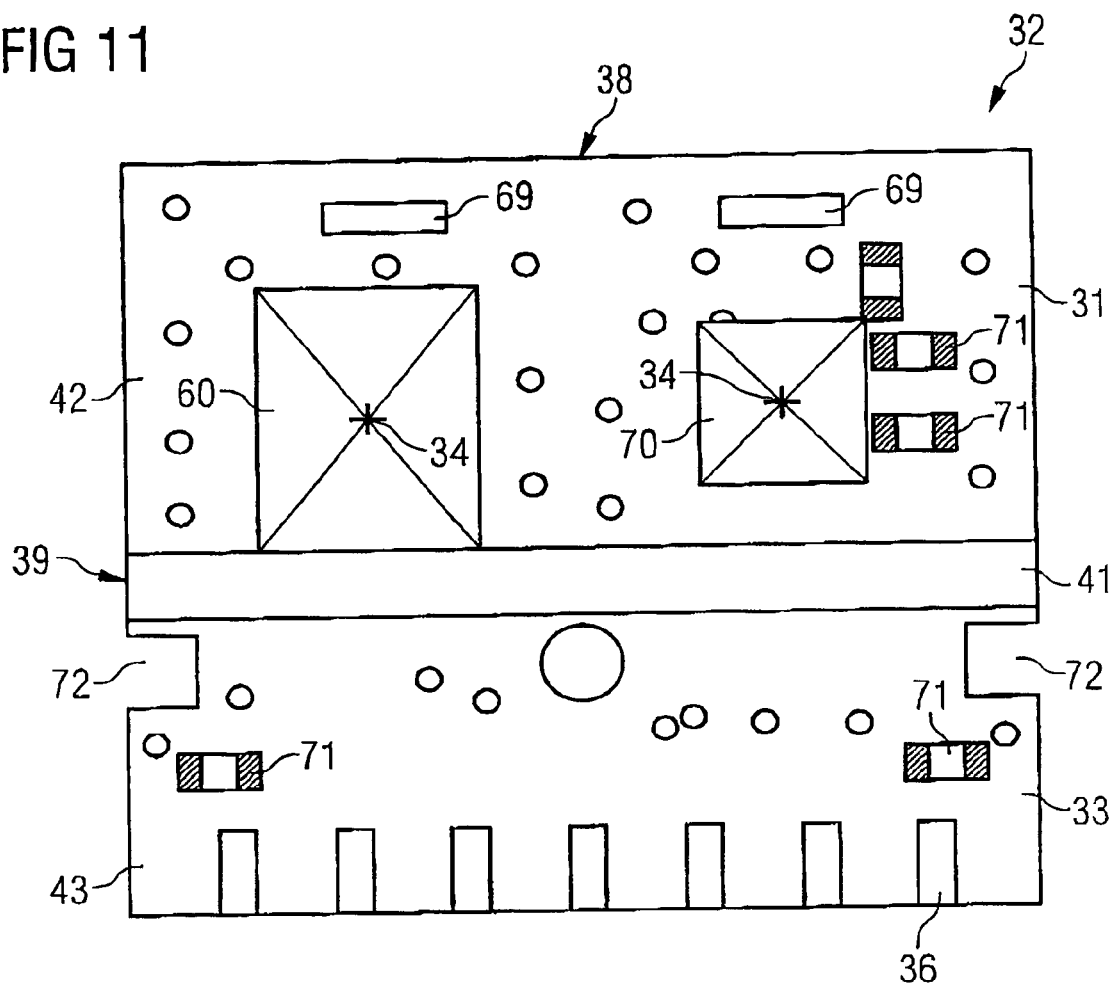
FIG. 11 shows a diagrammatic cross plan view of a connecting piece for an optoelectronic module.

FIG. 11 shows a diagrammatic plan view of a connecting piece 32 for an optoelectronic module 1. In this case, the connecting piece 32 may not be moulded, but rather may be a circuit carrier 38 having a first region 31 and a second region 33. The first region 31 can have two separate optoelectronic modules with each having two optical axes 34. One module can have the transmitting region 70 and the other module can receive the receiving region 60. Furthermore, the first region 31 and the second region 33 of the connecting piece 32 can have additional outer or external circuitries 71 in order to achieve an impedance matching of the outputs.

Furthermore, in the first region 31, openings 69 can be introduced for fixing to the header by material formed using a laser. At the second region 33 having the plug contact areas 36, which can be applied on both sides on the second region, cutouts 72 can be provided for fixing the second region 33 in a plug socket in the header. The two regions 31, 33 can be held together by a sheet 41 applied onto the circuit carrier in reinforcing fashion. In this case, the sheet 41 can be intended to protect the conductor tracks between the receiving region 60, the transmitting region 70, and the plug contact areas 36.

Figure 12:
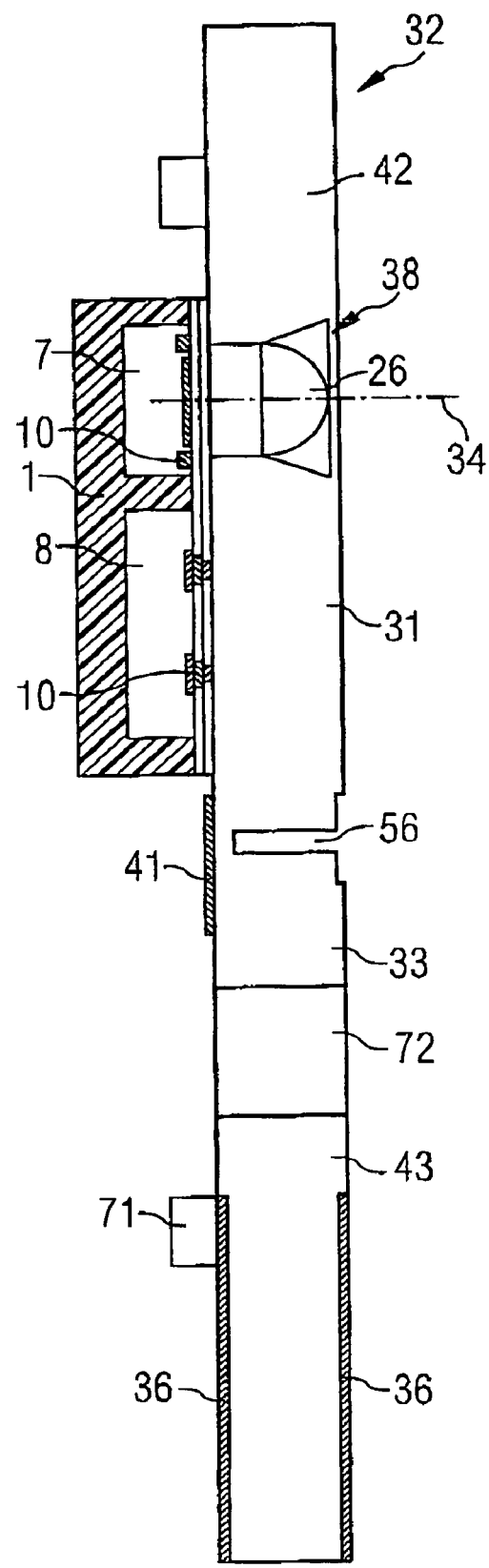
FIG. 12 shows a diagrammatic cross section through a connecting piece in accordance with FIG. 11.

FIG. 12 shows a diagrammatic cross section through a connecting piece 32 in accordance with FIG. 11. The connecting piece 32 can be realized by a circuit carrier 38. This circuit carrier 38 can have two regions. A first region 31 can carry the optoelectronic module 1 and a second region 33 can have the plug contact areas 36. Before this circuit carrier is angled between the two regions 31, 33, then, a sheet 41 can be applied onto the conductor track side of the circuit carrier 38 in the critical region of a boundary groove 56, which can be introduced by sawing between the regions 31, 33. The sheet 41 can be flexurally elastic and reinforce the region of the conductor tracks during the transition from the first region 31 to the second region 33. The second region can have a cutout 72 for fixing, and, if necessary, external circuitry elements 71.

Figure 13:
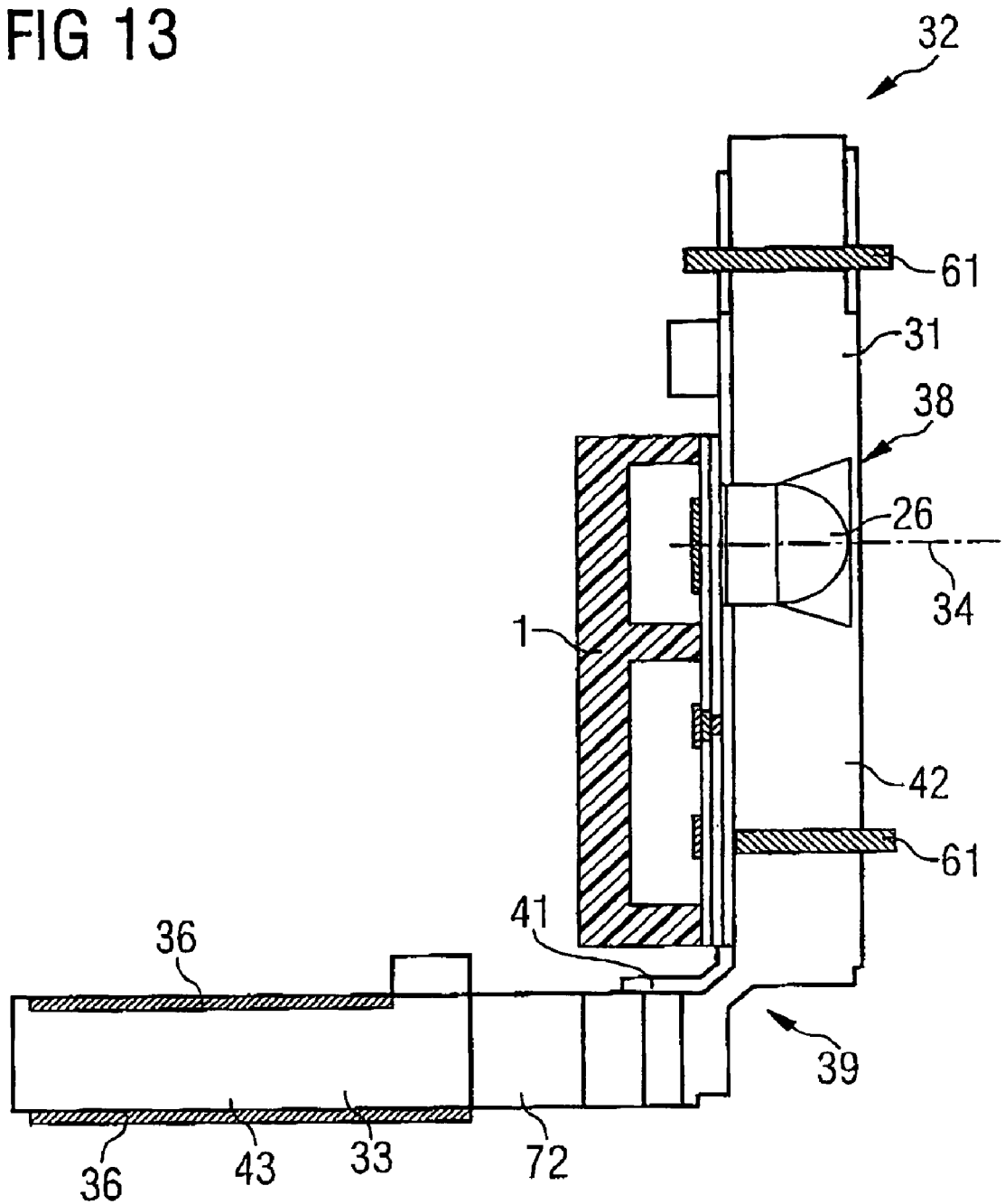
FIG. 13 shows a diagrammatic cross section through a connecting piece in accordance with FIG. 12 after a first region with the optoelectronic module has been angled relative to a second region with plug contact areas.

FIG. 13 shows a diagrammatic cross section through a connecting piece 32 in accordance with FIG. 12 after a first region 31 with the optoelectronic module 1 has been angled relative to a second region 33 with plug contact areas 36. In order to achieve an angled portion 39, the region of the boundary groove 56 shown in FIG. 12 may be heated and the regions 31 and 33 of the circuit carrier 38 may subsequently be angled with respect to one another without the circuit carrier breaking at the critical angling location 39. Components having functions identical to those in FIG. 12 are identified by the same reference symbols and are not discussed separately. After the circuit carrier 38 has been angled in this way, the connecting piece 32 may be inserted into a header.

Figure 14:
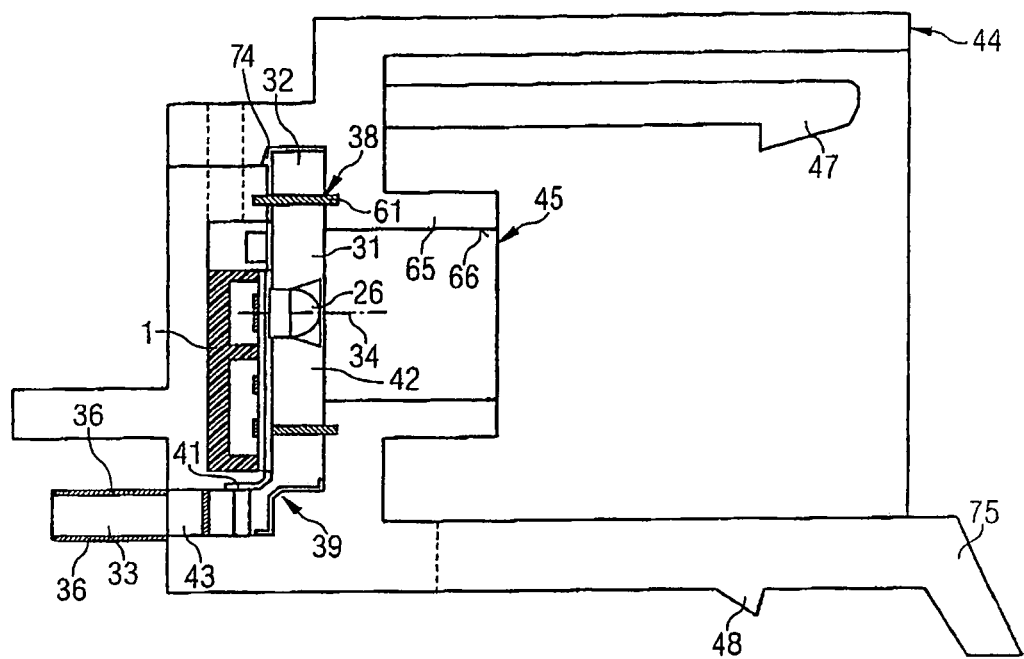
FIG. 14 shows a diagrammatic cross section through an optoelectronic module with a connecting piece and a header of a seventh embodiment of the invention.

FIG. 14 shows a diagrammatic cross section through an optical module 1 with a connecting piece 32 and a header 44 of a seventh embodiment of the invention. In this seventh embodiment of the invention, the header 44 has been integrally moulded. The cutouts can be prepared for insertion of the angled circuit carrier 38. Moreover, corresponding ventilation passages 74 can be used to ensure that a chimney effect results and, consequently, the optoelectronic module 1 can be cooled continuously. The header 44 can have, on the one hand, a snap-action hook as a lock or locking means 47 for the end piece or the holder of an optical fiber, which can be inserted into the plug-in region 45 with a fiber ferrule guide.

While a first limb 42 of the angled circuit carrier 38 can be is adapted to the plug-in region 45 with the aid of the fitting pins 61, a second limb 43 with the second region 33 and the plug contact areas 36 can project out of the header 44 such that the plug contact areas 36 can be inserted parallel to a superordinate circuit board (not shown) into a corresponding plug socket of the circuit board. During this insertion, a snap-action hook of the lock or locking means 48 can latch into a corresponding cutout of the circuit board or into a cutout of a protective housing. With a lug attachment 75, the locking means 48 can be released from the circuit board or the protective housing, if the end of the optical fiber has previously been pulled out of the header 44.

Figure 15:
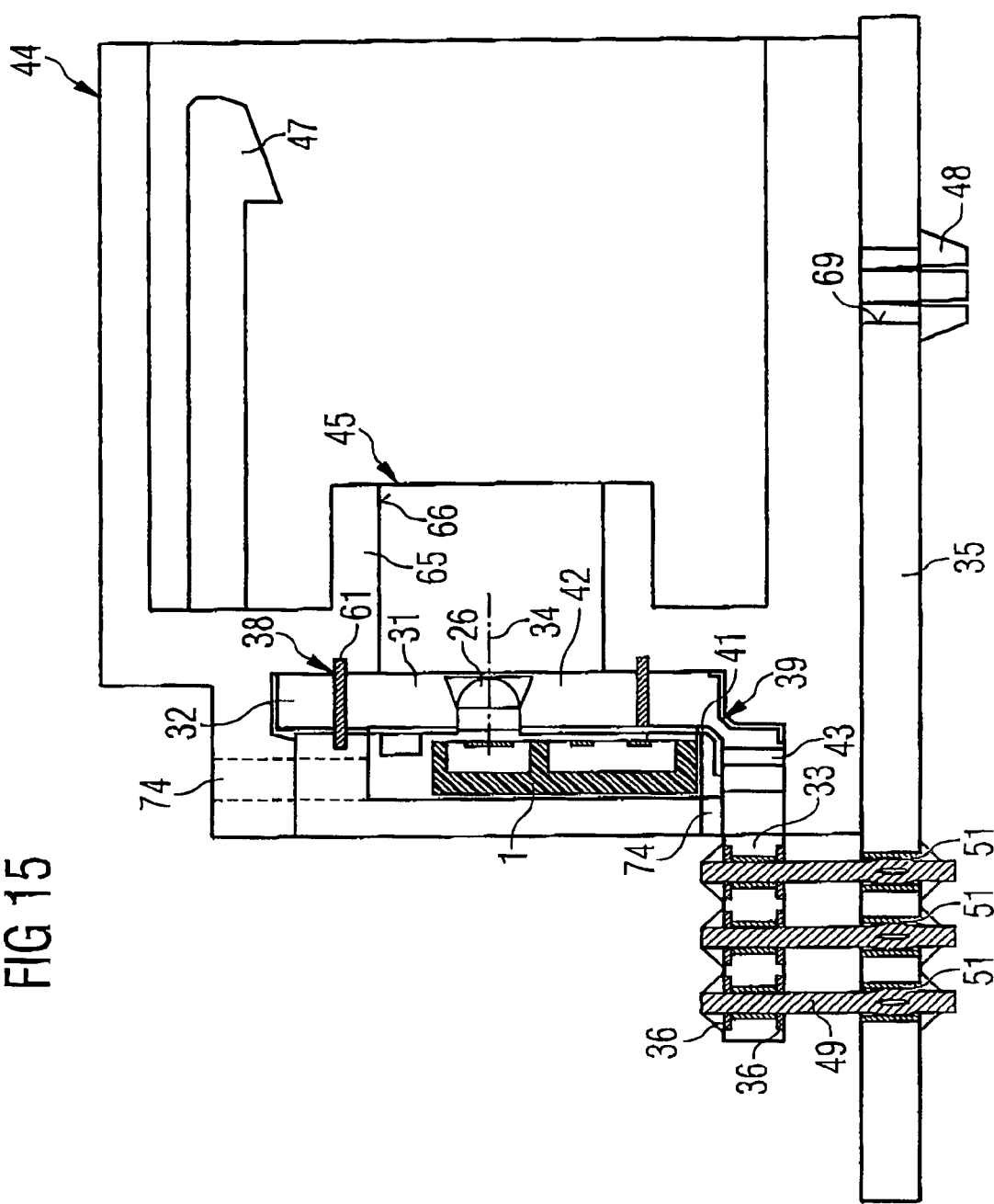
FIG. 15 shows a diagrammatic cross section through an optoelectronic module with a connecting piece, a header and a superordinate circuit board of an eighth embodiment of the invention.

FIG. 15 shows a diagrammatic cross section through an optoelectronic module 1 with a connecting piece 32 and a header 44 and a superordinate circuit board 35 of an eighth embodiment of the invention. In the eighth embodiment of the invention, an angled circuit carrier 38 having two regions 31, 33 can be used. Plug contact pins 49 can be provided in the second region of the circuit carrier 38. The plug contact pins 49 can be soldered to the plug contact areas 36 and arranged vertically with respect to the plug contact areas 36.

In this eighth embodiment of the invention, the header 44 with the optoelectronic module 1 and the connecting piece 32 can be plugged perpendicular to the superordinate circuit board 35 into corresponding through-contact openings 51 of the circuit board 35. At the same time as the plug contact pins 49 are plugged into the through-contact openings 51 of the circuit board 35, a lock or locking means 48 of the header 44 can be pressed through a corresponding opening 69 of the superordinate circuit board 35. The plug contact pins 49 can be soldered onto the superordinate circuit board 35 or, as shown in FIG. 16, correspondingly formed plug contact pins can spread resiliently elastically in the through-contact opening 51 of the superordinate circuit board 35.

Figure 16:
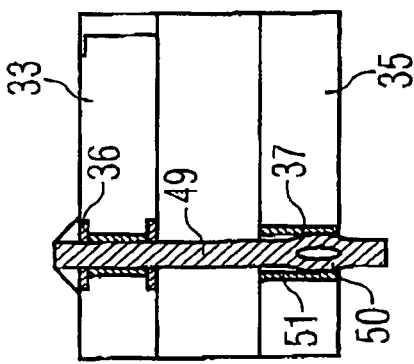
FIG. 16 shows a diagrammatic cross section through a plug contact between connecting piece and circuit board.

FIG. 16 shows a diagrammatic cross section through a plug contact pin 49 between the connecting piece and the circuit board 35, the plug contact pin 49 having an elastic spreader 50, which effects a sliding and pressing contact in the passage opening 51 of the superordinate circuit board 35. With a spreading contact-connection, the contact can be released without thermal treatment.

Figure 17:
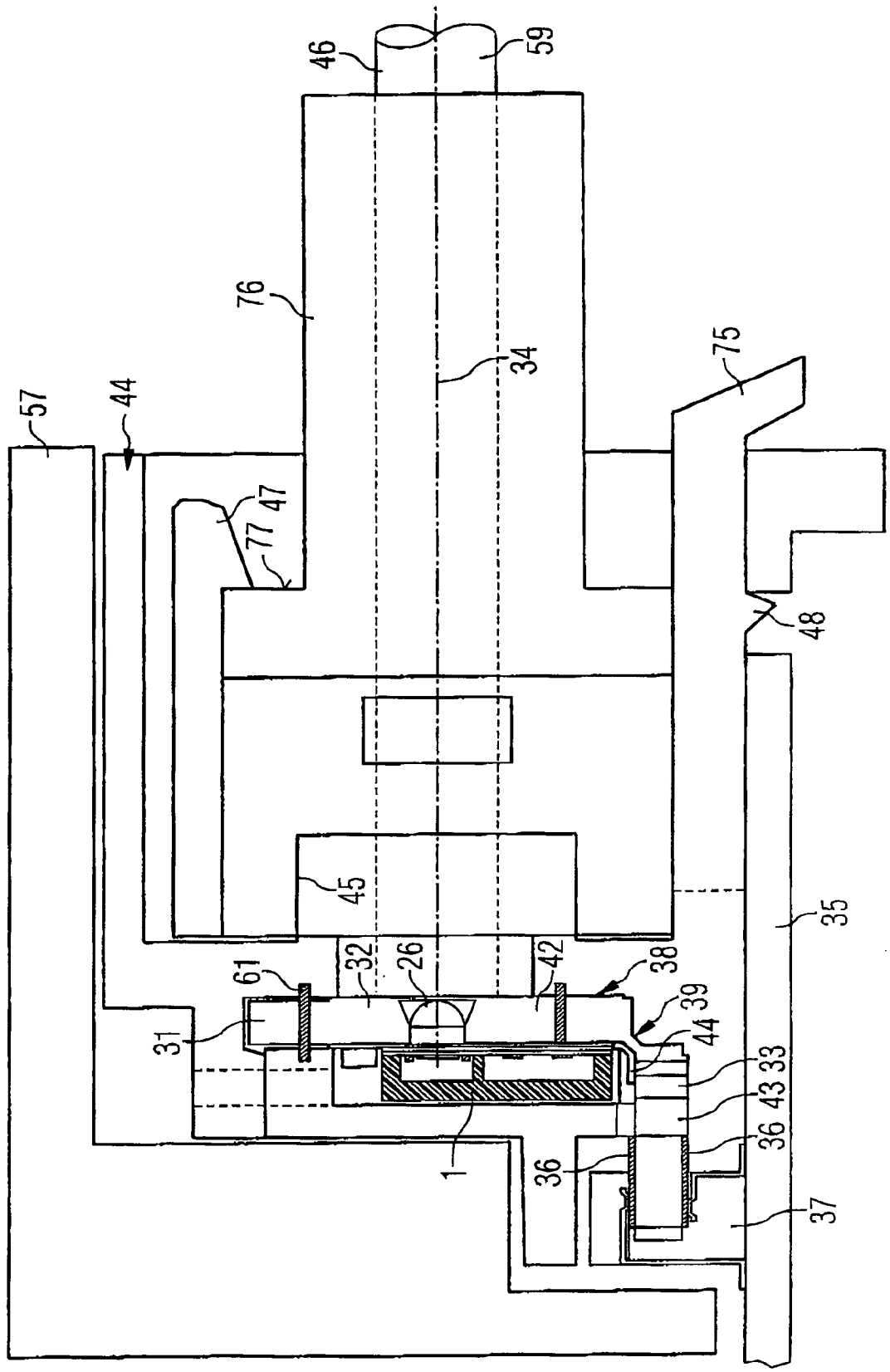
FIG. 17 shows a diagrammatic cross section through an optoelectronic module with a connecting piece, header and protective housing of a ninth embodiment of the invention.

FIG. 17 shows a diagrammatic cross section through an optoelectronic module 1 with a connecting piece 32 and header 44 and a protective housing 57 of a ninth embodiment of the invention. The electro-optical module 1 to be received in the protective housing 57 with a connecting piece 32 and header 44 corresponds to FIG. 14 so that components having similar functions to those in FIG. 14 have the same reference symbols and are not discussed separately.

In addition to the components explained and shown in FIG. 14, a protective housing 57 or plug-in housing for the header 44 can be provided on the superordinate circuit board 35. The end of an optical waveguide 46 in the form of an optical fiber 59 including comprising a polymer optical fiber 46 (POF) is shown in addition to the construction of the protective housing 57 into which the header 44 is plugged. The polymer optical fiber can be surrounded by a plug-in sleeve 76 or holder which can engage with the lock or locking means 47 and can have an attachment 77 for this purpose.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

LIST OF REFERENCE SYMBOLS

1 Optoelectronic module
2 Transmitter chip
3 Top side of the transmitter chip
4 Top side contact
5 Rear side of the transmitter chip
6 Rear side contact
7 Receiving chip
8 Amplifying chip
9 Driving or driver chip
10 Contact areas
11 Active top side
12 Passive components
13 Electrodes
14 Plastics composition
15 Overall top side
16 Contact pads
17 Connecting element
18 Base of the connecting element
19 Limb of the connecting element
20 Other limb of the connecting element
21 Bonding connection
22 Rewiring stratum
23, 24 Transparent insulation layer
25 Transparent insulation layer
26 Lens
27 Rewiring layer
28 Rewiring line
29 External contact area
31 First region of a connecting piece
32 Connecting piece
33 Second region of a connecting piece
34 Optical axis
35 Superordinate circuit board
36 Plug contact areas
37 Plug socket of the circuit board
38 Circuit carrier
39 Angled portion
40 Moulded interconnect device
41 Sheet
42 First limb
43 Second limb
44 Header
45 Plug-in region
46 Optical waveguide
47, 48 Locking means
49 Plug contact pins
50 Elastic spreader
21 Through-contact opening
52 Carrier
53 module position 54 External contacts
55 Panel
56 Boundary groove
57 Protective housing
58 VCSEL diode
59 Optical fiber
60 Receiving region
61 Fitting pins
62 Through-contact areas
63 Adhesive side
64 Conductive adhesive
65 Tubular section
66 Fiber ferrule guide
67 Dashed line
68 Conductor track
69 Opening
70 Transmission region
71 External circuitry
72 Cutout
73 Wafer sawing cut
74 Ventilation passage
75 Lug attachment
76 Plug-in sleeve
77 Attachment

We claim:

1. An optoelectronic module, comprising:
a semiconductor chip comprising an optical transmitter chip including: a light-wave-emitting top side with a top side contact for an anode, and a rear side with a rear side contact for a cathode;
further semiconductor chips for optical reception, for signal amplification, and/or for driving the semiconductor chip, the further semiconductor chips having contact areas on their active top sides;
passive components including electrodes, the passive components providing impedance matching; and
a plastic composition surrounding the optical transmitter chip, the further semiconductor chips, and the passive components;
wherein the light-wave-emitting top side of the optical transmitter chip, the active top sides of the further semiconductor chips with contact areas, the electrodes of the passive components, and the plastic composition form a coplanar overall top side, and wherein the overall top side includes a contact pad of a connecting element that connects the rear side contact of the optical transmitter chip to the contact pad.

2. The optoelectronic module according to claim 1, wherein the optical transmitter chip is an LED, an RCLED (Resonant Cavity LED), or a VCSE laser diode (Vertical Cavity Surface Emitting Laser Diode), and the light-wave-emitting top side includes a vertical cavity.

3. The optoelectronic module according to claim 1, wherein the connecting element has a base embedded in the plastic composite, the contact pad of the connecting element being accessible from the overall top side.

4. The optoelectronic module according to claim 3, wherein the connecting element has a bonding connection between the base and the rear side contact.

5. The optoelectronic module according to claim 1, wherein the connecting element is L-shaped and overlaps the rear side contact of the optical transmitter chip with a first limb of the L, a second limb of the L having the contact pad.

6. The optoelectronic module according to claim 1, wherein a rewiring stratum is arranged on the overall top side, the rewiring stratum alternately having transparent insulation layers with through contact openings and patterned rewiring layers with rewiring lines, external contact areas, and through-contact areas.

7. The optoelectronic module according to claim 1, wherein the module is arranged on a first region of a connecting piece with respect to an optical fiber and a superordinate circuit board such that an optical axis of optoelectronic components is oriented substantially parallel to the superordinate circuit board, and a second region of the connecting piece has plug contact areas, the plug contact areas adapted to be plugged into a plug socket of the circuit board.

8. The optoelectronic module according to claim 7, wherein the first and second regions are arranged in angled fashion with respect to one another and the second region can be plugged into a plug socket of the circuit board with its plug contact areas parallel to the circuit board.

9. The optoelectronic module according to claim 7, wherein the connecting piece has a molded interconnect device having a three-dimensional wiring.

10. The optoelectronic module according to claim 7, wherein the connecting piece is a circuit carrier capable of being divided into the first and second regions connected to one another by a flexible conductor track sheet.

11. The optoelectronic module according to claim 7, wherein the connecting piece is a circuit carrier having the first and second regions, the circuit carrier being bent in angled fashion, and a first limb of the angled portion having the first region and a second limb of the angled portion having the second region.

12. The optoelectronic module according to claim 11, wherein the angled second region of the connecting piece has plug contact pins perpendicular to the top side of the second angled region.

13. The optoelectronic module according to claim 12, wherein the plug contact pins have elastic spreaders adapted to latch into through-contact openings of the superordinate circuit board.

14. The optoelectronic module according to claim 7, wherein the optical module is arranged with the connecting piece at a header, the header having a plug-in region for one end of an optical waveguide and a locking mechanism adapted to fix the waveguide end in the header and fixedly clamp the header on the superordinate circuit board.

15. The optoelectronic module according to claim 7, wherein the optical module is arranged with the connecting piece at a header, the header having a plug-in region for one end of an optical waveguide and a lock adapted to fix the waveguide end in the header and fixedly clamp the header on the superordinate circuit board.

* * * * *